United States Patent
Janzen et al.

(12) 
(10) Patent No.: US 6,538,951 B1
(45) Date of Patent: Mar. 25, 2003

(54) DRAM ACTIVE TERMINATION CONTROL

(75) Inventors: Jeffery W. Janzen, Meridian, ID (US); Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/941,649

(22) Filed: Aug. 30, 2001

(51) Int. Cl.[7] ................................................ G11C 8/00
(52) U.S. Cl. ...................... 365/230.03; 365/51; 365/149
(58) Field of Search .......................... 365/230.03, 51, 365/52, 63, 149

(56) References Cited

U.S. PATENT DOCUMENTS 5,590,299 A * 12/1996 Bennett ...................... 711/157
5,636,214 A    6/1997 Kranzler et al.
5,729,152 A    3/1998 Leung et al.
5,926,031 A    7/1999 Wallace et al.
6,115,278 A *  9/2000 Deneroff et al. ............... 365/51
6,356,106 B1 * 3/2002 Greeff et al. .................. 326/30

* cited by examiner

*Primary Examiner*—Huan Hoang
(74) *Attorney, Agent, or Firm*—Dickstein Shapiro Morin & Oshinsky LLP (57) ABSTRACT

A method and apparatus for active termination control of a memory module is disclosed. A memory controller provides a single active termination control line per memory module which is used to control memory devices on both sides of a module. The active termination control signal is active for all write functions to the memory devices on the modules. A device read signal generated by the memory devices on one side of the module disables the active termination control signal for memory devices on both sides of the module to enable faster turnarounds between write and read operations.

30 Claims, 5 Drawing Sheets

DRAM ACTIVE TERMINATION CONTROL

FIELD OF THE INVENTION

The present invention relates to the control of an integrated memory circuit to provide active termination of a data bus. More particularly, the invention provides a system to control the active termination required for dynamic random access memory (DRAM) devices.

BACKGROUND

Modern systems strive to efficiently utilize computer memory in a way which increases speed and optimizes data transfer. This requires specialized techniques for controlling the reading and writing of information from and to memory, such as dynamic random access memory (DRAM), particularly with respect to high speed memory devices.

One proposed technique for controlling read/write operations in high speed DRAM devices divides DRAM memory devices into ranks which are turned on or off for data read/write operations via an active termination control signal supplied by a memory controller. The active termination control signal determines which rank of memory is being read from or written to. In these proposals, an 'on' signal enables a particular DRAM memory device to be written to and an 'off' signal enables a DRAM memory device to be read. For double sided memory modules which have a rank of memory on each side of the module, this requires two such control signals for each module. In other words, these proposals require at least one hard-wired active termination control signal for the front side of a memory module (Rank 0) and a separate hard-wired active termination control signal for the back side of a memory module (Rank 1).

Problems with such configurations include difficulty for the controller circuitry to hand off between reading and writing to/from different sides of modules. Furthermore, having two active termination control signals per module requires the use of two hard-wired active termination control signal paths per module and on the bus. This leads to read-write lag time inefficiencies between the controller circuitry and actual memory devices.

There is needed, therefore, a simple and inexpensive method of controlling reading and writing to different ranks of memory on a module.

BRIEF SUMMARY OF THE INVENTION

The present invention provides a simplified active termination control technique for each memory module which utilizes: (i) one controller-generated hard-wired active termination control signal per dual sided module which causes the data devices on both sides of the module to transition to an active termination state as a rank and (ii) a wired-OR signal path which causes a read operation at memory devices on either side of the module to disable the active termination control signal for memory devices on both sides of the module. Both the singular active termination control signal per module and the wired-OR signal path decrease lag time inefficiencies between the controller circuitry and read-write operations to memory ranks on a module.

These and other advantages and features of the invention will be more clearly understood from the following detailed description of the invention which is presented in conjunction with the accompanying drawings.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural, logical, and electrical changes may be made without departing from the spirit or scope of the invention.

The terms "on", "off", "high", "low", "logic", and/or "logic state" are used in the description as exemplary embodiments of the invention. It should be understood that the invention may also be implemented using logic states reversed from those described herein as well known in the art. Further, while various logic circuits are described and illustrated herein using specific logic gate arrangements, it should be understood that the invention may also be implemented with different logic gate configurations.

Figure 1:
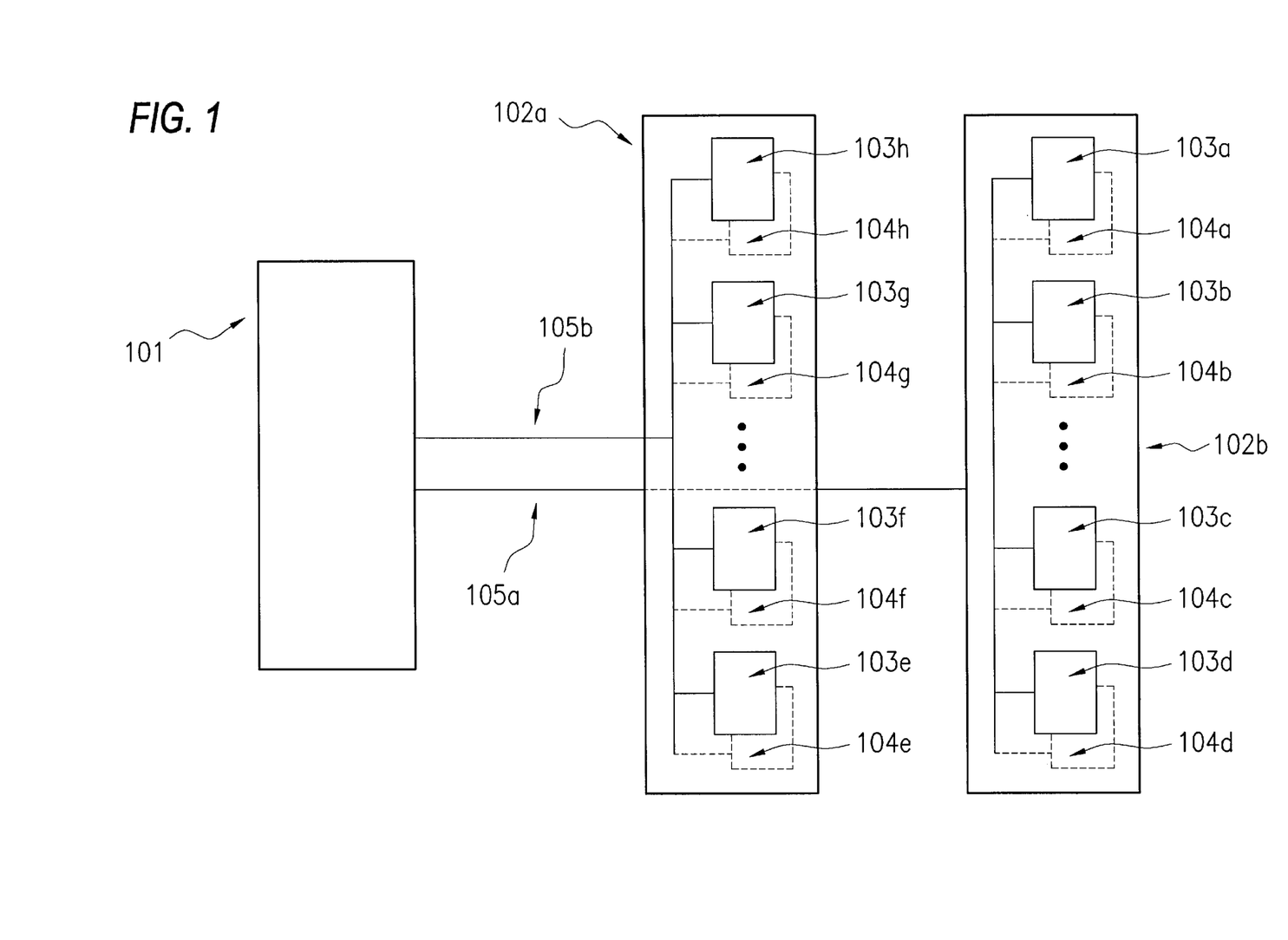
FIG. 1 is a block diagram of a memory system in one exemplary embodiment of the invention.

FIG. 1 represents a simplified bock diagram for a memory system in accordance with an exemplary embodiment of the invention. One active termination control signal 105(*a*), 105(*b*) is used for read-write operations of a respective DRAM memory module 102(*a*), 102(*b*). Each of the memory modules 102(*a*), 102(*b*) has a rank of memory devices on each side of the module. Thus, memory module 102(*a*) includes a rank of memory formed by memory devices 103(*e*), 103(*f*), 103(*g*), 103(*h*) on one side of the module and another rank formed by memory devices 104(*e*), 104(*f*), 104(*g*), 104(*h*) on the other side of the module. Likewise, memory module 102(*b*) has two ranks of memory devices on opposite sides of the module, one comprised of memory devices 103(*a*), 103(*b*), 103(*c*), 103(*d*) and the other comprised of memory devices 104(*a*), 104(*b*), 104(*c*), 104(*d*). The number of memory devices employed in each rank is not important as fewer or more memory devices can be used.

The active termination control signal 105(*a*), 105(*b*) determines which module of memory is being read from or written to for a respective module. An 'on' (or 'high') active termination control signal 105(*a*), 105(*b*) enables a particular DRAM module 102(*a*), 102(*b*) to be written to. An 'off' (or 'low') active termination control signal 105(*a*), 105(*b*) enables a DRAM module 102(*a*), 102(*b*) to be read.

Figure 2:
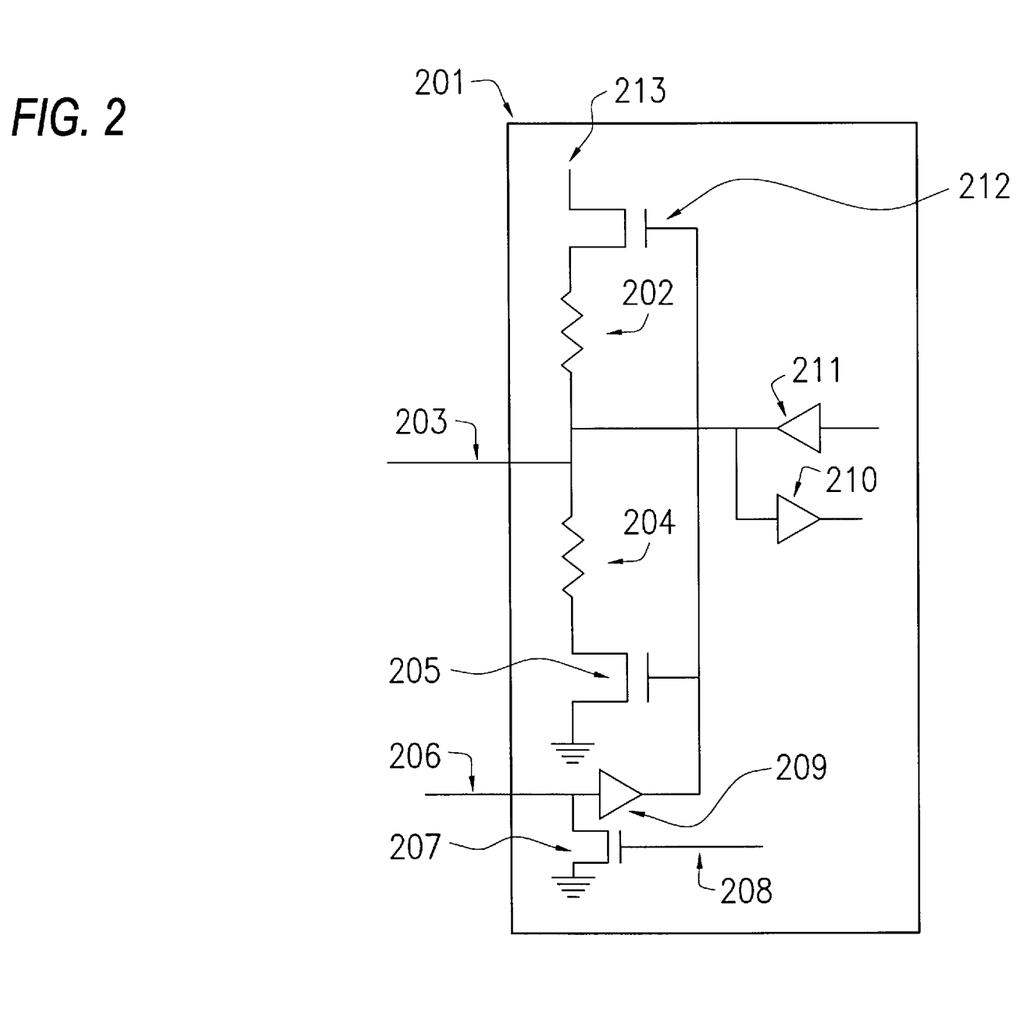
FIG. 2 is a schematic diagram of the active termination circuitry of a DRAM memory device employed as in FIG. 1.

FIG. 2 shows an embodiment of the active termination circuitry at each individual DRAM memory device. Input line 206 receives the active termination control signal 105(*a*) or 105(*b*) through buffer 209. When the signal is high it turns on transistors 205 and 212 to actively terminate a data path 203 with resistors 202 and 204. As such, input data on data path 203 is properly received by input data buffer 210.

Each memory device 201 also includes a control transistor 207 which receives at its gate via signal line 208 an internally generated signal when memory device 201 is performing a read operation. The device read signal line 208 going 'high' toggles the transistor 207 gate, pulling down the active termination control signal input line 206 to ground through the source to the drain of transistor 207, causing the active termination control signal input line 206 to go 'low', thereby quickly removing line termination during a device read operation when a read operation begins.

Figure 3:
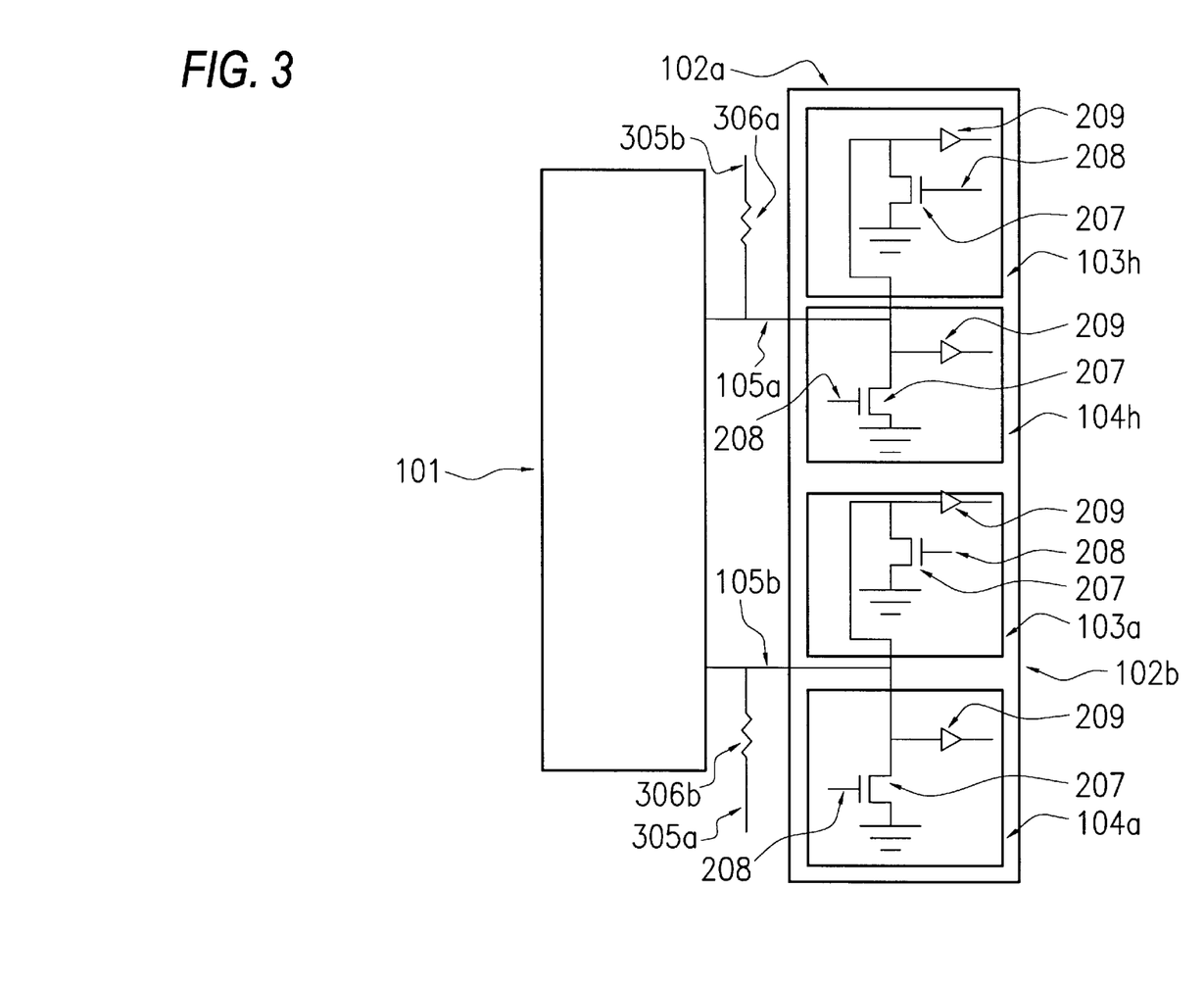
FIG. 3 is a schematic showing generation of an active termination control signal and its use in a DRAM memory device in accordance with the invention.

FIG. 3 shows how a pair of memory devices, e.g. 103(*a*), 104(*a*), 103(*h*), 104(*h*), from respective ranks of memory devices on opposite sides of a memory module, e.g., 102(*a*) or 102(*b*), are interconnected on each module. The control transistor 207 of a memory device, e.g., 103(*a*), of one rank is wired in an OR circuit to the input line 206 of a memory device, e.g., 104(*a*), of the other rank of a memory module, e.g. 102(*b*). That is, when either memory device, e.g., 103(*a*) or 104(*a*), of the two ranks of module 102(*b*) receives a 'high' signal on the device read signal line 208, it immediately pulls down the active termination control signal for both memory devices 103(*a*), 104(*a*). The same is true for each of the paired memory devices on opposite sides of memory module 102(*a*), e.g., 103(*e*) 104(*e*), 103(*f*) 104(*f*), 103(*g*) 104(*g*), 103(*h*) 104(*h*). Memory module 102(*b*) is constructed and arranged the same way.

With the invention, DRAM memory modules 102(*a*) or 102(*b*) transition as a module. This transition is managed either by the controller 101 controlling the high or low state of the active termination control lines 105(*a*), 105(*b*) to set the memory devices for a write operation, or by the memory device read signal on lines 208 of memory devices on either side of the memory modules 102(*a*), 102(*b*) eliminating the active termination control signal line for a read operation. Thus, the invention's dual control active termination control signal lines 105(*a*), 105(*b*) allow for optimization of memory functions. The bus turnaround lag time between controller 101 management of actual read-write operations to memory modules 102(*a*), 102(*b*) is reduced, leading to higher speed bus turnarounds between write and read operations.

Figure 4:
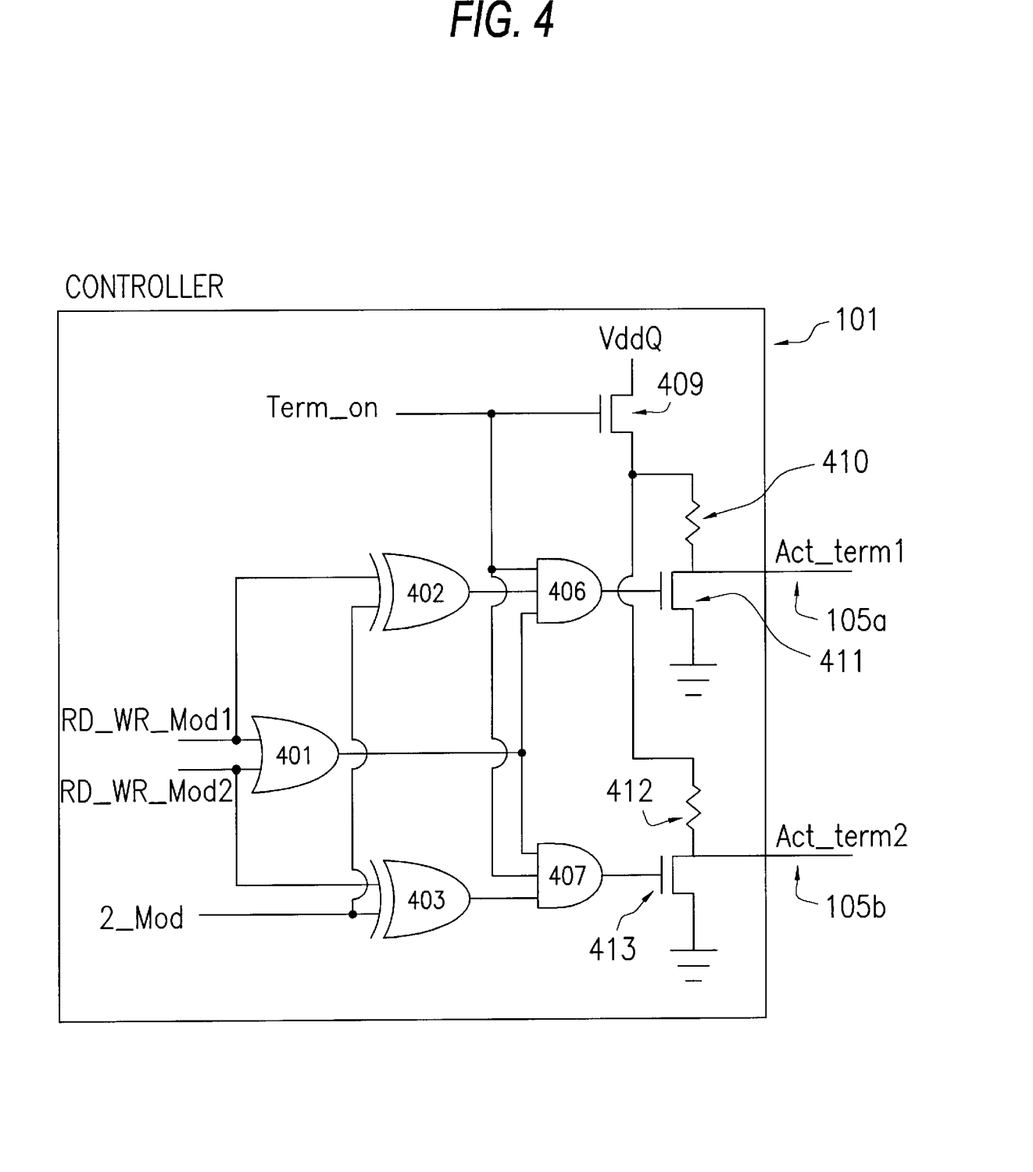
FIG. 4 is a schematic diagram of a portion of the controller illustrated in FIG. 1 showing generation of the active termination control signal at the controller.

FIG. 4 shows a portion of the exemplary memory controller 101 circuit for generating the active termination control signal Act_Term1 and Act_Term2 signals on lines 105(*a*) and 105(*b*) for respective memory modules 102(*a*) and 102(*b*). These two controller outputs are gated in response to the logic state of four input signals: (i) RD_WR_Mod1, (ii) RD_WR_Mod2, (iii) Term_On, and (iv) 2_Mod.

RD_WR_Mod1 is 'high' when either a read or write operation is to occur at memory module 102(*a*) and 'low' otherwise. RD_WR_Mod2 is 'high' when either a read or write operation is to occur at 102(*b*) and 'low' otherwise. 2_Mod is 'high' when both memory slots are populated, that is, when memory modules 102(*a*) and 102(*b*) are both present on the bus, and low if only one memory module is present. Term_On is normally 'high' and is the genesis of the active termination control signals, e.g., Act_Term1 or Act_Term2, regardless of which memory module target is being accessed. Term_On goes 'low' during Sleep, Suspend to RAM, or Standby Modes.

When either RD_WR_Mod1 or RD_WR_Mod2 are high as inputs to OR GATE 401, the output of OR GATE 401 goes high, providing inputs for AND GATES 406 and 407. These AND GATES (406 and 407) each have one input tied to the Term_On signal. AND GATES 406 and 407 have three inputs: (i) the Term_On signal, (ii) the output of OR GATE 401, and (iii) the outputs of respective Exclusive OR GATE 402 or 403.

When either RD_WR_Mod1 or RD_WR_Mod2 goes 'high', it provides a logic 'high' at the output of OR GATE 401, providing AND GATES 406 and 407 a 'high' signal as one of three required inputs. Another logic 'high' is provided by the Term_On signal (unless the system is in Standby or Sleep Mode). The final inputs for AND GATES 406 and 407 comes from a respective output of one of the Exclusive OR GATES 402 or 403.

Exclusive OR GATE 402 has two inputs. The first input comes from the RD_WR_Mod1 signal, previously discussed as going 'high' when indicating a read-write function to memory module 102(*a*) (FIG. 1). The second input to Exclusive OR GATE 402 comes from the 2_Mod signal, which is 'high' when the system is populated with two memory modules. Similarly, Exclusive OR GATE 403 has two inputs. The first comes from the RD_WR_Mod2 signal and the second input comes from the 2_Mod signal.

The purpose of the 2_Mod signal and Exclusive OR GATES 402 and 403 is to provide a 'low' input to AND GATES 406 or 407 when both memory modules 102(*a*), 102(*b*) (FIG. 1) slots are occupied and there is an active read-write function being processed by one of the memory modules. Thus, if the RD_WR_Mod1 signal is 'high' and 2_Mod is 'high' from dual memory module 102(*a*), 102(*b*) (FIG. 1) population, then Exclusive OR GATE 402's output will be 'low'. This 'low' will toggle the output of AND GATE 406 'low', opening the circuit between the source and the drain of transistor 411, allowing the active termination control signal Act_Term1 to go 'high' in response to the Term_On signal. When AND GATE 406 goes 'high', transistor 411 is 'on' and Act_Term1 goes 'low'.

Similarly, if the RD_WR_Mod2 signal is 'high' and 2_Mod is 'high' from dual memory module population, then Exclusive OR GATE 403's output will be 'low.' This 'low' will toggle the output of AND GATE 407 'low', opening the circuit between the source and the drain of transistor 413, allowing the active termination control signal Act_Term2 to go 'high.'

Figure 5:
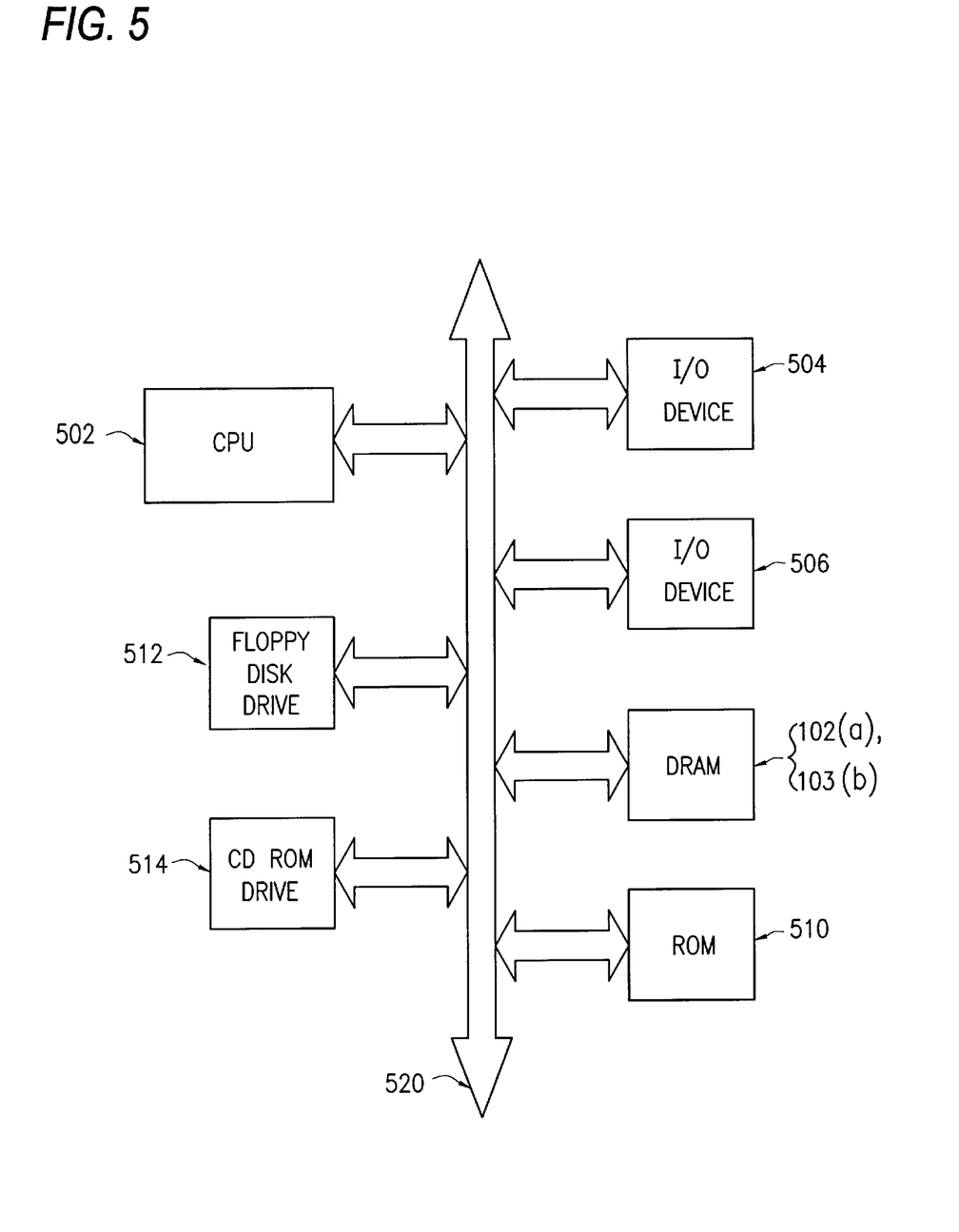
FIG. 5 is a block diagram of the DRAM memory modules illustrated in FIG. 1 showing integration of the memory modules into a computer system.

FIG. 5 illustrates a block diagram of a processor system 500 utilizing the technique as described in FIGS. 1–4 in a computer system for active termination control of a signal path. The processor-based system 500 may be a computer system or any other processor system. The system 500 includes a central processing unit (CPU) 502, e.g., a microprocessor, that communicates with floppy disk drive 512, DRAM memory modules, e.g., 102(*a*), 102(*b*), and CD ROM drive 514 over a bus 520. In one embodiment of the invention, the central processing unit 502 ("processor") may provide the active termination control signal instead of the active termination control signal being provided by the controller 101. It must be noted that the bus 520 may be a series of buses and bridges commonly used in a processor-based system, but for convenience purposes only, the bus 520 has been illustrated as a single bus. Input/output (I/O) devices, e.g., a monitor and/or network cards, 504, 506 may also be connected to the bus 520, but are not required in order to practice the invention. The processor-based system 500 also includes a read-only memory (ROM) 510 which may also be used to store a software program.

The present invention provides a simple technique for active termination of memory devices on a memory module which provides a faster turnaround of data on a bus when transitioning from a write to a read operation.

The above description illustrates exemplary embodiments that achieve the features and advantages of the present invention. It is not intended that the present invention be limited to the illustrated embodiments. Modifications and substitutions to specific operations, conditions and logic structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method of controlling active termination of a data line at a memory module comprising:
   receiving an external active termination control signal at a memory module and actively terminating memory devices of said module in response to receiving of said control signal and;
   disabling said control signal at said memory module for all memory devices on said module during a read operation in response to at least one signal generated at said module.

2. A method as defined in claim 1, further comprising:
   generating said active termination control signal at a memory controller.

3. A method as in claim 2 wherein:
   said control signal is generated as a first logic state and is disabled by forcing said control signal to a second logic state.

4. A method of controlling active termination of a data line at a memory module comprising:
   receiving an external active termination control signal at a memory module and actively terminating memory devices of said module in response to receiving of said control signal; and
   disabling said control signal at said memory module for all memory devices on said module during a read operation in response to at least one signal generated at said module;
   wherein
      said memory module contains a first group of memory devices and a second group of memory devices, each group of said memory devices receiving said active termination control signal, and wherein said method further comprises disabling said active termination control signal for both groups of memory devices in response to a signal generated from the memory devices of either said first or second group during a read operation.

5. A method as in claim 4 wherein:
   said first and second groups of memory devices are respectively provided on first and second sides of said memory module.

6. A method of controlling an active termination device located within a memory device provided as part of a first memory group on a memory module, said method comprising:
   receiving an external active termination control signal having a first logic state at said memory device during at least a write operation to said memory device; and
   changing said received active termination control signal to a second logic state at said memory device in response to the presence of a read operation at said memory device or to a read operation at another memory device provided as part of a second memory group on said memory module;
   wherein,
      said first and second memory groups are respectively provided on first and second sides of said memory module.

7. A method for controlling active termination of a data line at a memory module comprising:
   receiving an external active termination control signal at a memory device and in response terminating a data path and;
   disabling said active termination control signal at said memory device to remove termination of said data path during a read operation in response to a signal generated by said memory device.

8. A method as in claim 7, further comprising:
   generating said active termination control signal at a memory controller.

9. A method for controlling active termination of a data line at a memory module comprising:
   receiving an external active termination control signal at a memory device and in response terminating a data path; and
   disabling said active termination control signal at said memory device to remove termination of said data path during a read operation in response to a signal generated by said memory device;
   wherein,
      said memory device is provided on a memory module which contains a first group of said memory devices and a second group of said memory devices, each of said memory devices receiving said active termination control signal and, in response, terminating a data path threat, and wherein said method further comprises disabling said active termination control signal for both groups of said memory devices in response to signals generated at memory devices of either said first or second group when a read operation is performed.

10. A method as in claim 9 wherein:
    said first and second groups of memory devices are respectively provided on first and second sides of said memory module.

11. A method for controlling active termination of a data line at a memory device provided on a memory module connected in a computer system, said method comprising:
    receiving an active termination control signal at said memory device and, in response, actively terminating said data line and;
    disabling said active termination control signal at said memory device in response to a signal generated by said memory device or by another memory device provided on said memory module during a read operation.

12. A method of controlling active termination of a data line at a memory device provided on a memory module connected in a computer system, said method comprising:
    receiving an active termination control signal at said memory device and, in response, actively terminating said data line; and
    disabling said active termination control signal at said memory device in response to a signal generated by said memory device or by another memory device provided on said memory module during a read operation,
    wherein,
      said memory device and said another memory device are respectively provided on first and second sides of said memory module.

13. A method of controlling active termination of a data line at a memory device provided on a memory module connected in a computer system, said method comprising:

receiving an active termination control signal at said memory device and, in response, actively terminating said data line; and disabling said active termination control signal at said memory device in response to a signal generated by said memory device or by another memory device provided on said memory module during a read operation, wherein said data line is operatively connected to a first memory device of a first group of memory devices, and a second memory device of a second group of memory devices on said memory module, each of said first and second memory devices receiving said active termination control signal and, in response, terminating said data line, and wherein said method further comprises disabling said active termination control signal for said first and second memory devices in response to a signal generated at either said first or second memory devices during a read operation.

14. A method as in claim 13 wherein:

said first and second groups of memory devices are respectively provided on opposite sides of a memory module.

15. An apparatus for controlling active termination of a data line at a first memory device comprising:

an input line on said first memory device for receiving an active termination control signal;

a data line termination circuit for terminating a data line in response to receipt of said active termination control signal;

a switch provided between said input line and termination circuit for terminating receipt by said termination circuit of said active termination control signal by a signal generated by said first memory device in response to a read operation occurring at said first memory device.

16. An apparatus for controlling active termination of a data line at a first memory device comprising:

an input line on said first memory device for receiving an active termination control signal;

a data line termination circuit for terminating a data line in response to receipt of said active termination control signal; and a switch provided between said input line and termination circuit for terminating receipt by said termination circuit of said active termination control signal by a signal generated by said first memory device in response to a read operation occurring at said first memory device;

wherein, said first memory device is provided on a memory module and said switch circuit is operative to terminate said receipt of said active termination control signal by said termination circuit by a signal generated by a second memory device on said module whenever a read operation occurs at a second memory device.

17. An apparatus as in claim 16 wherein said first and second memory devices are provided on opposite sides of said module.

18. An apparatus for controlling active termination of a data line at a memory module comprising:

first and second memory devices respectively provided on opposite sides of a memory module, said first and second memory devices being connected to a common data line;

an active termination circuit at each memory device for actively terminating said data line in response to receipt of an active termination control command, and;

control circuitry at each said memory device for preventing termination of said active termination circuit at each memory device whenever either of said first and second memory devices is performing a read operation.

19. An apparatus as in claim 18 wherein:

each said control circuit prevents said active termination control signal from being applied to said active termination circuit.

20. A memory module comprising:

a first group of memory devices provided at a first side of said module;

a second group of memory devices provided at a second side of said module, each memory device of said second group sharing at least one data line of a data bus with a corresponding memory device of said first group;

each of said memory devices comprising:

a termination circuit for terminating an associated data line during a write operation in response to an active termination control signal provided on a control signal line of said data bus, and;

a control circuit responsive to a first control signal for preventing said termination circuit from terminating said associated data line, said first control signal being generated by said each memory device or by a corresponding memory device of another group whenever either performs a read operation.

21. A memory system, comprising:

a plurality of memory modules, each being responsive to a respective active termination control signal, each memory module comprising:

a first group of memory devices provided at a first side of said module;

a second group of memory devices provided at a second side of said module, each memory device of said second group sharing at least one data line of a data bus with a corresponding memory device of said first group;

each of said memory devices comprising:

a termination circuit for terminating an associated data line during a write operation in response to an active termination control signal provided on a control signal line of said data bus, and;

a control circuit responsive to a first control signal for preventing said termination circuit from terminating said associated data line, said first control signal being generated by said each memory device or by a corresponding memory device of another group whenever either performs a read operation.

22. A memory system, comprising:

a memory controller providing a plurality of active termination control signals, said active termination control signals enabled in a first logic state and disabled in a second logic state, and;

a plurality of said memory modules, each being responsive to a said respective active termination control signal, each said memory module comprising:

a first group of memory devices provided at a first side of said module;

a second group of memory devices provided at a second side of said module, each memory device of said second group sharing at least one data line of a data bus with a corresponding memory device of said first group;

each of said memory devices comprising:
   a termination circuit for terminating an associated data line during a write operation in response to an active termination control signal provided on said active termination control signal input line, and;
   a control circuit responsive to a first control signal for preventing said termination circuit from terminating said associated data line, said control signal being generated by said each memory device or by a corresponding memory device of another group whenever either performs a read operation.

23. A memory system, comprising:
a memory controller providing a respective active termination control signal per memory module, said respective active termination control signal enabled in a first logic state and disabled in a second logic state, and;
a plurality of said memory modules, each being responsive to said respective active termination control signal, each memory module comprising:
   an active termination control signal input line;
   a first group of memory devices provided at a first side of said module;
   a second group of memory devices provided at a second side of said module, said first group and second group of memory devices within a said respective individual memory module connected to said active termination control signal input line, said first and second group of memory devices within a respective individual memory module transitioning to said first logic state simultaneously in response to a write operation occurring at said respective individual memory module;
   each of said memory devices comprising:
      a termination circuit for terminating an associated data line during a write operation in response to said first logic state received at said active termination control signal input line, and;
      a control circuit responsive to a first control signal for preventing said termination circuit from terminating said associated data line, said first control signal being generated by said each memory device or by a corresponding memory device of another group whenever either performs a read operation.

24. A processor system for controlling active termination of a data line at a first memory device comprising:
   a processor for causing issuance of an active termination control signal to a first memory device, said active termination control signal enabling active termination of a data line at said first memory device when said first memory device comprises a first logic state and disabling said active termination when in a second logic state;
   an input line on said first memory device for receiving an active termination control signal;
   a data line termination circuit for terminating a data line in response to receipt of said active termination control signal;
   a switch provided between said input line and termination circuit for terminating receipt by said termination circuit of said active termination control signal by a signal generated by said first memory device in response to a read operation occurring at said first memory device.

25. A processor system for controlling active termination of a data line at a first memory device comprising:
   a processor for causing issuance of an active termination control signal to a first memory device, said active termination control signal enabling active termination of a data line at said first memory device when said first memory device comprises a first logic state and disabling said active termination when in a second logic state;
   an input line on said first memory device for receiving an active termination control signal;
   data line termination circuit for terminating a data line in response to receipt of said active termination control signal;
   a switch provided between said input line and termination circuit for terminating receipt by said termination circuit of said active termination control signal by a signal generated by said first memory in response to a read operation occurring at said first memory device;
   wherein,
      said first memory device is provided in a first rank of memory on a memory module and said switch circuit is operative to terminate said receipt of said active termination control signal by said termination circuit by a signal generated by a second memory device provided in a second rank of memory on said module whenever a read operation occurs at a second memory device.

26. An processor system as in claim 25 wherein said first and second memory devices are provided on opposite sides of said module.

27. A processor system for controlling active termination of a data line at a memory module comprising:
   a processor causing transmission of an active termination control signal to a memory module, first and second memory devices respectively provided on opposite sides of said memory module, said first and second memory devices being connected to a common data line;
   an active termination circuit at each memory device for actively terminating said data line in response to receipt of an active termination control command, and;
   control circuitry at each said memory device for preventing termination of said active termination circuit at each memory device whenever either of said first and second memory devices is performing a read operation.

28. An processor system as in claim 27 wherein:
each said control circuit prevents said active termination control signal from being applied to said active termination circuit.

29. A processor and memory module system comprising:
a processor;
a first group of memory devices provided at a first side of said module;
a second group of memory devices provided at a second side of said module, each memory device of said second group sharing at least one data line of a data bus with a corresponding memory device of said first group;
each of said memory devices comprising:
   a termination circuit for terminating an associated data line during a write operation in response to an active termination control signal provided on a control signal line of said data bus, and;
   a control circuit responsive to a first control signal for preventing said termination circuit from terminating said associated data line, said first control signal being generated by said each memory device or by a corresponding memory device of another group whenever either performs a read operation.

30. A processor and memory system, comprising:

a processor for causing transmission of a plurality of active termination control signals used to control active termination at memory devices;

a plurality of memory modules, each being responsive to a said respective active termination control signal, each memory module comprising:

a first group of memory devices provided at a first side of said module;

a second group of memory devices provided at a second side of said module, each memory device of said second group sharing at least one data line of a data bus with a corresponding memory device of said first group;

each of said memory devices comprising:

a termination circuit for terminating an associated data line during a write operation in response to a said respective active termination control signal provided on a control signal line of said data bus, and;

a control circuit responsive to a first control signal for preventing said termination circuit from terminating said associated data line, said first control signal being generated by said each memory device or by a corresponding memory device of another group whenever either performs a read operation.

* * * * *

UNITED STATES PATENT AND TRADEMARK OFFICE
CERTIFICATE OF CORRECTION

PATENT NO. : 6,538,951 B1
DATED : March 25, 2003
INVENTOR(S) : Jeffery W. Janzen et al.

It is certified that error appears in the above-identified patent and that said Letters Patent is hereby corrected as shown below:

Column 2,
Line 34, replace "bock" with -- block --.

Column 10,
Line 8, replace "data" with -- a data --.
Line 14, replace "memory in" with -- memory device in --.

Signed and Sealed this

Seventh Day of October, 2003

JAMES E. ROGAN
*Director of the United States Patent and Trademark Office*